United States Patent
Morooka et al.

(10) Patent No.: US 7,845,071 B2
(45) Date of Patent: Dec. 7, 2010

(54) METHOD OF MANUFACTURING ELECTRONIC PART

(75) Inventors: Hisao Morooka, Chuo-ku (JP); Hideaki Ninomiya, Chuo-ku (JP); Junichi Shimamura, Chuo-ku (JP); Kazuo Nishi, Kanagawa (JP)

(73) Assignees: TDK Corporation, Tokyo (JP); Semiconductor Energy Laboratory Co., Ltd., Atsugi-shi (JP)

( * ) Notice: Subject to any disclaimer, the term of this patent is extended or adjusted under 35 U.S.C. 154(b) by 966 days.

(21) Appl. No.: 11/072,989

(22) Filed: Mar. 7, 2005

(65) Prior Publication Data
US 2005/0210666 A1 Sep. 29, 2005

(30) Foreign Application Priority Data
Mar. 24, 2004 (JP) .............................. 2004-087279

(51) Int. Cl.
H05K 3/30 (2006.01)
(52) U.S. Cl. .............................. 29/832; 29/825; 29/833; 29/840
(58) Field of Classification Search .................. 29/825, 29/832, 840, 833
See application file for complete search history.

(56) References Cited

U.S. PATENT DOCUMENTS

2002/0037605 A1 3/2002 Ninomiya et al.

2005/0058167 A1* 3/2005 Kuramachi et al. ........... 372/43

FOREIGN PATENT DOCUMENTS

| JP | 02-244772 | * | 9/1990 |
| JP | A-8-316300 | | 11/1996 |
| JP | A-10-12910 | | 1/1998 |
| JP | A 2002-100790 | | 4/2002 |

OTHER PUBLICATIONS

Sep. 30, 2009 Office Action issued in JP2004-087279.

* cited by examiner

Primary Examiner—C. J Arbes
(74) Attorney, Agent, or Firm—Oliff & Berridge, PLC

(57) ABSTRACT

The present invention provides a substrate holding method capable of contributing to improvement in performance of an electronic part. A plastic film is adhered to a holding frame by using an adhesive tape having a proper gas releasing characteristic such that total quantity of gas detected when analysis using gas chromatograph mass spectrometry (dynamic HS-GC-MS) is conducted under test conditions of 180° C. and 10 minutes is 100.5 µg/g or less in n-tetradecane. In the case where the plastic film held by the holding frame is subjected to a process of manufacturing an electronic part (for example, a solar battery), even when a process accompanying generation of heat during the manufacturing process (for example, a film forming process such as plasma CVD) is performed on the plastic film, a release amount of unnecessary gas released from the adhesive tape due to the influence of the heat is suppressed, so that deterioration in the performance of the electronic part caused by the unnecessary gas is suppressed.

20 Claims, 6 Drawing Sheets

METHOD OF MANUFACTURING ELECTRONIC PART

BACKGROUND OF THE INVENTION

1. Field of the Invention

The present invention relates to a substrate holding method for holding a flexible substrate typified by a plastic film on a holding jig and to a method of manufacturing an electronic part by using the substrate holding method.

2. Description of the Related Art

In recent years, as an electronic equipment is becoming mobile and wearable, a smaller and flexible electronic part is demanded. To address such a technical demand, for example, the material of a substrate used for forming an electronic device as a main part of an electronic part is being changed from a material having rigidity typified by a ceramics substrate, an FPC (Flexible Printed Circuit) board, a glass substrate, and the like to a material having flexibility typified by a plastic film. An example of the electronic part accompanying the technical demand is a small solar battery provided in a clock or the like. The electronic part is not easily cracked, is bendable, and can be processed in an arbitrary shape since a flexible substrate is used, so that the electronic part has an advantage from the viewpoint of portability. By using the advantage, development of an active display is also being progressed.

In the case of using a flexible substrate (for example, a plastic film) in order to manufacture an electronic part, for example, a problem occurs in handling of the plastic film from the following two viewpoints. First, since the plastic film generally has low rigidity and a high coefficient of thermal expansion, when heat (concretely, heat cycle) is generated during various processes (for example, in a film forming process) in a process of manufacturing an electronic part, the plastic film is thermally deformed by the influence of the heat. Specifically, the plastic film is contracted or warped. When the plastic film is thermally deformed, the dimensions of the plastic film change, so that it becomes difficult to control the dimensional precision of the electronic part. Second, since the plastic film is generally thin and deflectable, when an external force is applied during a process of manufacturing an electronic part, the plastic film is physically deformed by the influence of the external force. Specifically, the plastic film is broken or a wrinkle occurs. Since the plastic film is physically easily deformed and cannot be conveyed in the manufacturing process, it is difficult to put the plastic film in an electronic parts automatic manufacturing line.

In consideration of the problems, some techniques have been proposed to improve the handling of a plastic film. Concretely, a technique of holding a plastic film by a holding frame by adhering the plastic film to the holding frame by using an adhesive tape in a process of manufacturing an electronic part is known (refer to, for example, Japanese Patent Laid-Open No. 2002-100790). In the technique, particularly, in order to make the plastic film stably held by suppressing thermal deformation of the holding frame, the holding frame having a coefficient of thermal expansion which is less than 10 ppm/° C. is used.

In the case of manufacturing an electronic part by forming an electronic device on a plastic film, naturally, also in the case of using the plastic film, the performance of the electronic part has to be assured to the same degree as that in the case of using a ceramics substrate or the like. In the conventional electronic part manufacturing method, as described above, by adhering the plastic film to the holding frame by using the adhesive tape, the plastic film can be stably held by using the holding frame. On the other hand, since the adhesive is used to make the plastic film held by the holding frame, there is a problem such that the performance of the electronic part tends to deteriorate due to the existence of the adhesive.

SUMMARY OF THE INVENTION

The present invention has been achieved in consideration of such problems and its first object is to provide a substrate holding method capable of contributing to improvement in the performance of an electronic part.

A second object of the invention is to provide a method of manufacturing an electronic part, capable of improving the performance of an electronic part by using the substrate holding method of the invention.

According to the invention, there is provided a method of holding a flexible substrate on a holding jig, wherein the substrate is adhered to the holding jig by using an adhesive whose total quantity of gas detected when analysis using gas chromatograph mass spectrometry is conducted under test conditions of 180° C. and 10 minutes is 100.5 µg/g or less in n-tetradecane.

In the substrate holding method according to the invention, a flexible substrate is adhered to a holding jig by using an adhesive whose total quantity of gas detected when analysis using gas chromatograph mass spectrometry is conducted under test conditions of 180° C. and 10 minutes is 100.5 µg/g or less in n-tetradecane, thereby holding the substrate by the holding jig. Since an adhesive having a proper gas release characteristic is used, for example, in the case where the substrate is subjected to a process of manufacturing an electronic part in a state where it is held by the holding jig, even when a process accompanying generation of heat (for example, film forming process typified by plasma CVD) is performed on the substrate during the manufacturing process, the release amount of unnecessary gas released from the adhesive influenced by the heat, that is, gas exerting an adverse influence on the performance of an electronic part is suppressed. The "gas chromatograph mass spectrometry" is, strictly, dynamic head space-gas chromatograph-mass spectrometry (HS-GC-MS). The dynamic HS-GC-MS is also called purge & trap-gas chromatograph-mass spectrometry (P&T-GC-MS).

The invention also provides a method of manufacturing an electronic part, wherein a flexible substrate is adhered to the holding jig by using an adhesive whose total quantity of gas detected when analysis using gas chromatograph mass spectrometry is conducted under test conditions of 180° C. and 10 minutes is 100.5 µg/g or less in n-tetradecane, and then an electronic device is formed on the substrate to manufacture an electronic part.

In the method of manufacturing an electronic part according to the invention, a flexible substrate is adhered to the holding jig by using an adhesive whose total quantity of gas detected when analysis using gas chromatograph mass spectrometry is conducted under test conditions of 180° C. and 10 minutes is 100.5 µg/g or less in n-tetradecane, and then an electronic device is formed on the substrate to manufacture an electronic part. Consequently, as described above, the release quantity of unnecessary gas released from the adhesive during the process of manufacturing an electronic part is suppressed. In this case, as compared with the case where the performance of the electronic part tends to deteriorate due to unnecessary gas released from the adhesive since the substrate is held by the holding jig by using the adhesive which does not have a proper gas releasing characteristic, deterioration in the performance of an electronic part due to the unnecessary gas is suppressed.

In the substrate holding method or the electronic part manufacturing method according to the invention, as the adhesive, an acrylic adhesive from which gas containing aliphatic hydrocarbon, aliphatic alcohol, and acrylic ester is detected may be used. An adhesive may be prepared by using a pre-adhesive for preparing the adhesive and heating the pre-adhesive so that the total gas quantity becomes 100.5 µg/g or less in n-tetradecane. In particular, as the substrate, it is preferable to use a substrate having a thermal contraction property. The "aliphatic hydrocarbon" is not limited to a pure compound constructed by carbon and hydrogen (a compound which does not contain elements other than carbon and hydrogen) but includes a compound obtained by substituting part of the skeleton of hydrocarbon and a compound in which a derivative is constructed by introducing another skeleton to the hydrocarbon skeleton. Obviously, the definition of the "aliphatic hydrocarbon" (including a substituted compound and a derivative compound) is also similarly applied to the "aliphatic alcohol" and "acrylic ester".

In the method of manufacturing an electronic part according to the invention, a solar battery may be manufactured as the electronic part by forming a solar cell as the electronic device. In particular, in the case of preparing an adhesive by heating a pre-adhesive, it is preferable to heat the pre-adhesive under heating conditions of 200° C. and 120 minutes. In this case, the step of forming the solar battery device may include a step of forming a conductive film, a step of forming a semiconductor film by using chemical vapor deposition (CVD), a step of forming a pattern film by using a screen printing method, or a step of patterning a film to be patterned by using a laser.

In the substrate holding method according to the invention, the substrate is adhered to the holding jig by using the adhesive having a proper gas releasing characteristic such that the total quantity of gas detected when analysis using the gas chromatograph mass spectrometry is carried out under the test conditions of 180° C. and 10 minutes is 100.5 µg/g or less in n-tetradecane. Consequently, for example, in the case where the substrate held by the holding jig is subjected to the process of manufacturing an electronic part, the release quantity of gas exerting an adverse influence on the performance of an electronic part is suppressed. Therefore, the invention can contribute to improvement in performance of an electronic part.

In the electronic part manufacturing method according to the invention, the substrate holding method of the invention is used and the substrate is held by the holding jig by using the adhesive having a proper gas releasing characteristic, so that a release amount of unnecessary gas released from the adhesive during the process of manufacturing the electronic part is suppressed, and deterioration in the performance of the electronic part caused by the unnecessary gas is suppressed. Therefore, the performance of the electronic part can be improved.

Other and further objects, features and advantages of the invention will appear more fully from the following description.

DETAILED DESCRIPTION OF THE PRFERRED EMBODIMENTS

Embodiments of the invention will be described in detail hereinbelow with reference to the drawings.

Figure 1:
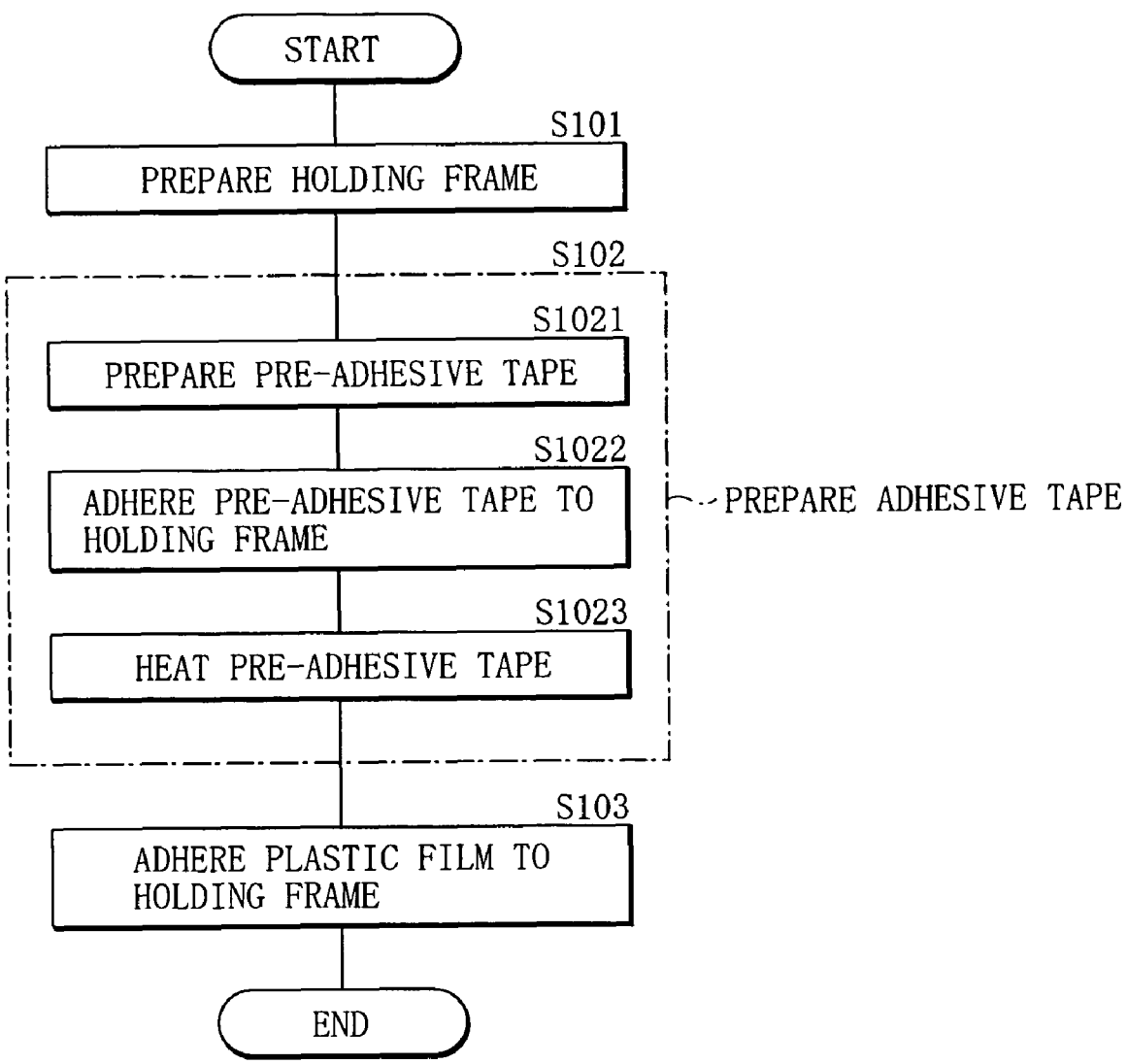
FIG. 1 is a flowchart for explaining the flow of a substrate holding method according to an embodiment of the invention.
Figure 3:
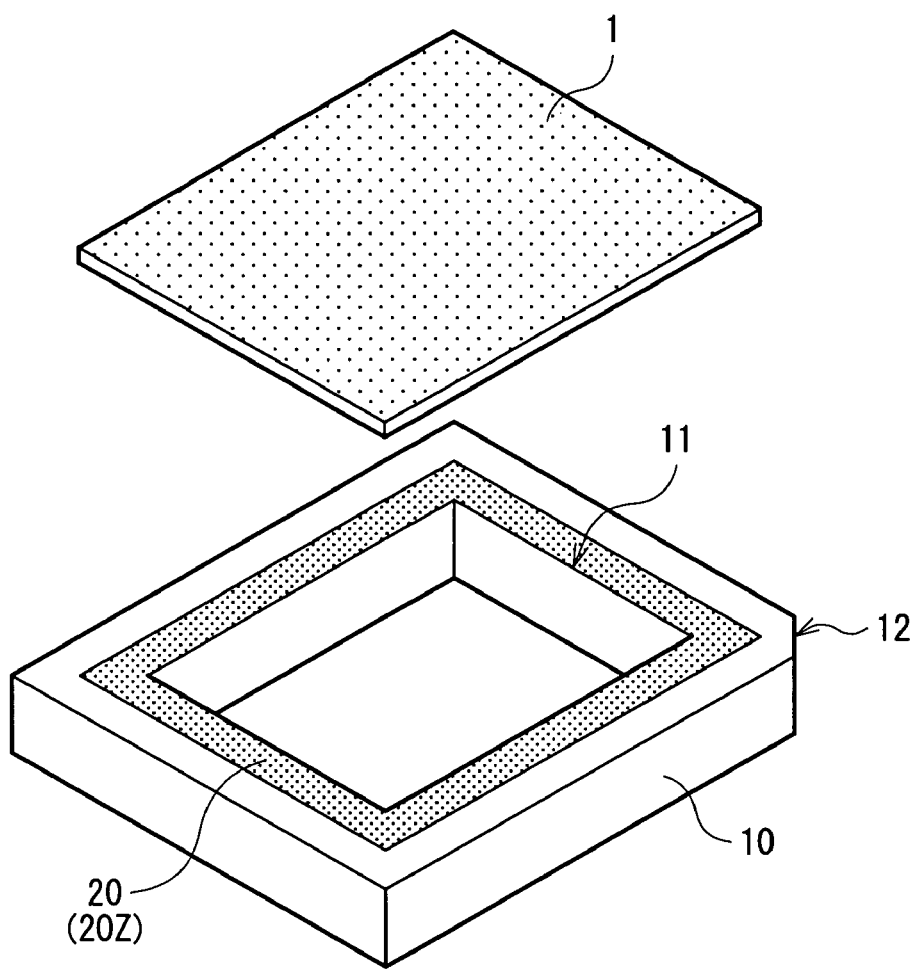
FIG. 3 is a perspective view for explaining the substrate holding procedure subsequent to FIG. 2.
Figure 4:
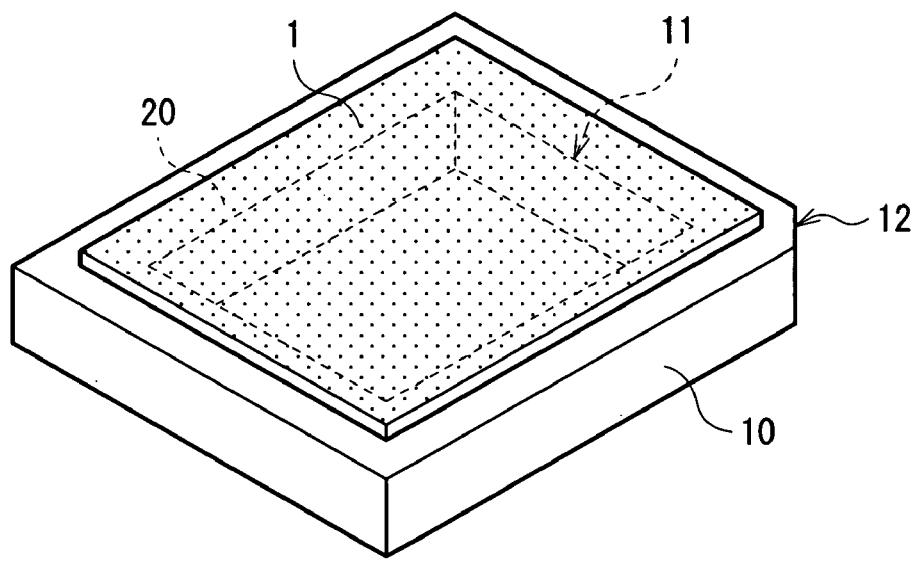
FIG. 4 is a perspective view for explaining the substrate holding procedure subsequent to FIG. 3.

First, by referring to FIGS. 1 to 4, a substrate holding method according to an embodiment of the invention will be described. FIG. 1 is provided to explain the flow of the substrate holding method, and FIGS. 2 to 4 are provided to explain the procedure for holding a substrate.

The substrate holding method according to the embodiment is a method of holding a flexible substrate typified by, for example, a plastic film on a holding jig and is applied to a method of manufacturing an electronic part typified by a solar battery.

Figure 2:
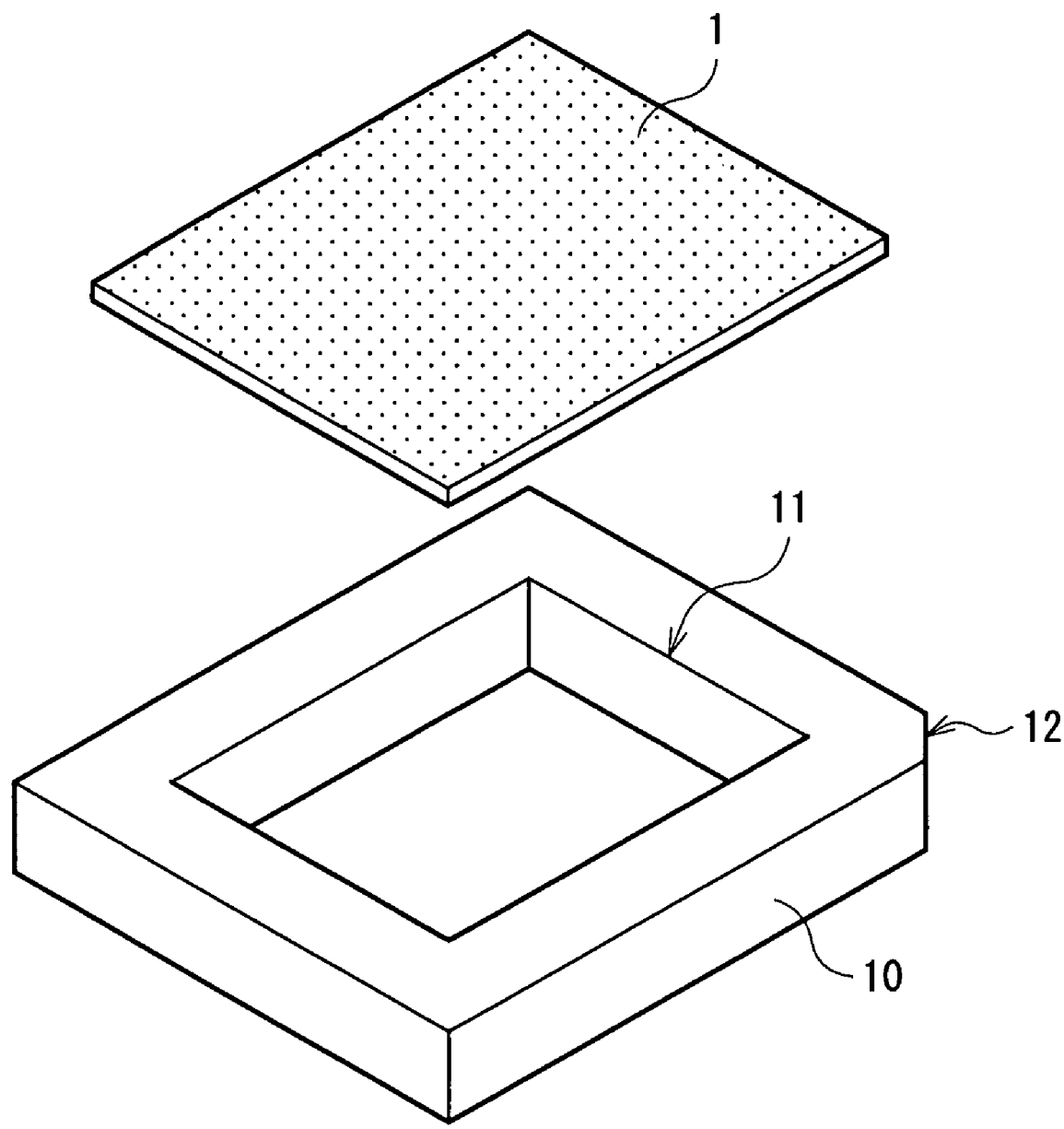
FIG. 2 is a perspective view for explaining a substrate holding procedure.

In an example of the substrate holding method, in the case of using a plastic film 1 as a flexible substrate, first, as shown in FIG. 2, a holding frame 10 as a holding jig is prepared (step S101 in FIG. 1).

The plastic film 1 is made of, for example, polyethylene naphthalate (PEN) and is a sheet obtained by cutting a PEN film wound in a roll so as to be in arbitrary dimensions. Preferably, the plastic film 1 has a thermal contraction property so as not to have a wrinkle by being stretched by thermal contraction when the plastic film 1 is influenced by heat in a state where it is held by the holding frame 10. The material of the plastic film 1 is not always limited to PEN but can be freely selected. For example, in place of PEN, polyethylene terephthalate (PET), polyether sulfone (PES), polyimide, or the like can be used.

The holding frame 10 is a dedicated jig for holding and fixing the plastic film 1 and is made of, for example, a ceramics-metal composite material such as silicon carbide (SiC)-aluminum (Al) complex. The holding frame 10 has, for example, a frame structure having an almost rectangular shape in which a rectangular opening 11 is formed. The dimension of the opening 11 is designed so as to be smaller than the outside diameter of the plastic film 1. Specifically, a taper 12 is provided at an arbitrary corner of the holding frame 10 so that the user of the holding frame 10 can recognize the orientation of the holding frame 10 on the basis of the position of the taper 12.

After the holding frame 10 is prepared, an adhesive tape 20 of a double-face type is prepared as an adhesive for adhering the plastic film 1 to the holding frame 10 as shown in FIG. 3 (step S102 in FIG. 1). As the adhesive tape 20, an adhesive tape having a proper gas release property and whose gas total quantity detected when analysis using gas chromatograph mass spectrometry is conducted under test conditions of 180° C. and 10 minutes is 100.5 µg/g or less in n-tetradecane is prepared. The "gas" is a generic name for organic and inorganic gases which can be detected by the analysis using the gas chromatograph mass spectrometry. The "gas chromatograph mass spectrometry" is, strictly, dynamic head space-gas chromatograph-mass spectrometry (HS-GC-MS). The dynamic HS-GC-MS is also called purge & trap-gas chromatograph-mass spectrometry (P&T-GC-MS).

An example of the procedure of preparing the adhesive tape 20 is as follows.

First, as a pre-adhesive for preparing the adhesive tape 20, a pre-adhesive tape 20Z is prepared (step S1021 in FIG. 1). The pre-adhesive tape 20Z is a pre-adhesive used for adhering the plastic film 1 to the holding frame 10. Concretely, the pre-adhesive tape 20Z does not have a proper gas releasing property necessary for the adhesive tape 20, that is, does not satisfy the condition that gas total quantity detected when analysis using gas chromatograph mass spectrometry is conducted under the test conditions of 180° C. and 10 minutes is 100.5 µg/g or less in n-tetradecane. At the time of preparing the pre-adhesive tape 20Z, for example, an adhesive tape of an acrylic material (whose main component is an acrylic compound) from which gas including aliphatic hydrocarbon, aliphatic alcohol, and acrylic ester is detected in analysis using the gas chromatograph mass spectrometry is prepared. The "aliphatic hydrocarbon" is not limited to a pure compound constructed by carbon and hydrogen (a compound which does not contain elements other than carbon and hydrogen) but includes a compound obtained by substituting part of the skeleton of hydrocarbon and a compound in which a derivative is constructed by introducing another skeleton to the hydrocarbon skeleton. Obviously, the definition of the "aliphatic hydrocarbon" (including a substituted compound and a derivative compound) is also similarly applied to the "aliphatic alcohol" and "acrylic ester".

Subsequently, for example, as shown in FIG. 3, the pre-adhesive tape 20Z is adhered to the holding frame 10 so as to surround the opening 11 from four sides (step S1022 in FIG. 1). At the time of adhering the pre-adhesive tape 20Z to the holding frame 10, it is not always necessary to adhere the pre-adhesive tape 20Z so as to surround the opening 11 from four sides. To prevent occurrence of a wrinkle in the plastic film 1 when the plastic film 1 is adhered to the holding frame 10 by using the adhesive tape 20 in a post process (refer to FIG. 4), it is preferable to adhere the pre-adhesive tape 20Z so as to surround the opening 11 from four sides.

Finally, a heating equipment such as a clean oven is used to heat the pre-adhesive tape 20Z so that the total quantity of gas detected when analysis using the gas chromatograph mass spectrometry is conducted under the test conditions of 180° C. and 10 minutes becomes equal to or less than 100.5 µg/g in n-tetradecane (step S1023 in FIG. 1). The heating conditions at this time (heating temperature, heating time, and the like) can be freely set as long as the total quantity of the gas satisfies the above-described conditions. Concretely, for example, the relation between the heating conditions of the pre-adhesive tape 20Z and the total quantity of the gas is obtained in advance by using the gas chromatograph mass spectrometry, in other words, the heating conditions under which the total quantity of gas detected when analysis using the gas chromatograph mass spectrometry is conducted under the test conditions of 180° C. and 10 minutes on the pre-adhesive tape 20Z becomes 100.5 µg/g or less are grasped in advance. On the basis of the heating conditions, the pre-adhesive tape 20Z is heated. In such a manner, the adhesive tape 20 having a proper gas releasing characteristic is prepared.

After the adhesive tape 20 is prepared, finally, for example, as shown in FIG. 4, the plastic film 1 is adhered to the holding frame 10 by using the adhesive tape 20 (step S103 in FIG. 1). At the time of adhering the plastic film 1 to the holding frame 10, the whole adhesive tape 20 adhered to the opening 11 so as to surround it from four sides in the preceding process is used and the opening 11 is closed with the plastic film 1. In such a manner, the plastic film 1 is adhered to the holding frame 10 by using adhesive strength of the adhesive tape 20, that is, the plastic film 1 is held by the holding frame 10 via the adhesive tape 20, and the substrate holding process is completed.

After that, for example, in the case where the plastic film 1 is subjected to a process of manufacturing an electronic part in a state where it is held by the holding frame 10, when a process accompanying generation of heat (for example, film forming process typified by plasma CVD (Chemical Vapor Deposition)) is performed on the plastic film 1 during the manufacturing process, the plastic film 1 is thermal-contracted by being influenced by the heat generated at the time of the process. Consequently, by using tension accompanying the thermal contraction, the plastic film 1 is uniformly stretched so as not to include a wrinkle, that is, the surface of the plastic film 1 is made flat. Since the adhesive tape 20 used for adhering the plastic film 1 to the holding frame 10 has a proper gas releasing characteristic, the release quantity of unnecessary gas released from the adhesive tape 20 influenced by the heat, that is, gas exerting an adverse influence on the performance of an electronic part is suppressed.

In the substrate holding method according to the embodiment, the plastic film 1 is adhered to the holding frame 10 by using the adhesive tape 20 having a proper gas releasing characteristic such that the total quantity of gas detected when analysis using the gas chromatograph mass spectrometry is carried out under the test conditions of 180° C. and 10 minutes is 100.5 µg/g or less in n-tetradecane. Therefore, for example, in the case where the plastic film 1 is subjected to the process of manufacturing an electronic part, even if a process accompanying generation of heat is performed on the plastic film 1 during the manufacturing process, the release quantity of unnecessary gas released from the adhesive tape 20 due to the influence of the heat is suppressed. Therefore, the invention can contribute to improvement in performance of an electronic part.

In particular, in the embodiment, a proper gas releasing characteristic of the adhesive tape 20, that is, the permissible range of a gas release quantity by which the performance of an electronic part can be assured is specified on the basis of the result of the analysis using the gas chromatograph mass spectrometry (dynamic HS-GC-MS) known as a general gas spectrometry. Consequently, the gas release quantity of the adhesive tape 20 can be easily measured by using the gas chromatograph mass spectrometry and the permissible range of the gas release quantity can be also easily specified on the basis of the gas release quantity. Moreover, the permissible range of the gas release quantity is specified by conversion using a specific substance (for example, n-tetradecan) in consideration of the fact that various kinds of gases are released from the adhesive tape 20, the permissible range of the gas release quantity can be specified with high reproducibility irrespective of the material of the adhesive tape 20. Therefore, improvement in the performance of an electronic part can be realized easily and stably.

In the embodiment, the pre-adhesive tape 20Z having no proper gas release characteristic is used. By heating the pre-adhesive tape 20Z and making the gas release characteristic proper, the adhesive tape 20 is prepared. Also in the case where the pre-adhesive tape 20Z does not have a proper gas release characteristic prepared for adhering the plastic film 1 to the holding frame 10, by performing heating process on the pre-adhesive tape 20Z, the pre-adhesive tape 20Z which does not have a proper gas release characteristic can be also converted to the adhesive tape 20 having a proper gas release characteristic. More concretely, for example, when the user buys and uses a commercially available double-faced tape (pre-adhesive tape 20Z) for adhering the plastic film 1 to the holding frame 10 and the double-faced tape does not have a proper gas release characteristic, by performing heating process on the double-faced tape, the gas release characteristic is made proper. The heated double-faced tape (adhesive tape 20) can be used for adhering the plastic film 1 to the holding frame 10. Therefore, the adhesive tape 20 is not limited to an adhesive tape initially having a proper gas release characteristic but the pre-adhesive tape 20Z such as a commercially available both-faced tape can be converted to the adhesive tape 20 and the resultant adhesive tape 20 can be used. Thus, improvement in the performance of an electronic part can be realized more easily.

In the embodiment, the plastic film 1 is adhered to the holding frame 10 by using the adhesive tape 20 so that, naturally, the plastic film 1 can be held by the holding frame 10 by using adhesive strength of the adhesive tape 20. In this case, particularly, by using the plastic film 1 having heat contractility, for example, when the plastic film 1 is subjected to a process of manufacturing an electronic part as described above, the plastic film 1 is uniformly stretched so as not to have a wrinkle by heat contraction by being influenced by heat generated during the manufacturing process. Consequently, the surface of the plastic film 1 is made flat. Therefore, occurrence of a wrinkle in the plastic film 1 can be prevented and the plastic film 1 can be made flat easily.

In the embodiment, as the procedure of preparing the adhesive tape 20 having a proper gas release characteristic, the pre-adhesive tape 20Z is adhered to the holding frame 10 and heated, thereby making the gas release characteristic proper. However, the invention is not always limited to the method. For example, the gas release characteristic may be also made proper by pre-heating the pre-adhesive tape 20Z before the pre-adhesive tape 20Z is adhered to the holding frame 10. In this case, the adhesive tape 20 is prepared by pre-heating the pre-adhesive tape 20Z and the prepared adhesive tape 20 is adhered to the holding frame 10. Different from the case where the pre-adhesive tape 20Z is adhered to the holding frame 10 and heating process is performed, the process of performing the heating process on the pre-adhesive tape 20Z during the process of manufacturing an electronic part becomes unnecessary. Therefore, the method can contribute to simplification of the process of manufacturing an electronic part.

In the embodiment, as the pre-adhesive tape 20Z, an acrylic adhesive tape from which gas including aliphatic hydrocarbon, aliphatic alcohol, and acrylic ester is detected is used. The invention is not limited to the acrylic adhesive tape. The material of the pre-adhesive tape 20Z can be freely changed and the kind of gas detected when analysis using the gas chromatograph mass spectrometry is conducted can be also freely changed according to the material of the pre-adhesive tape 20Z. Concretely, a silicon adhesive tape (made of a material whose main component is a silicon compound) from which gas containing siloxane is detected may be used as the pre-adhesive tape 20Z. In this case as well, effects similar to those of the foregoing embodiment can be obtained.

Although the adhesive tape 20 is used as an adhesive for adhering the plastic film 1 to the holding frame 10 in the embodiment, the invention is not limited to the adhesive tape 20. As long as an adhesive can stably adhere the plastic film 1 to the holding frame 10, the mode of the adhesive can be freely changed. Concretely, for example, as the adhesive, a gel adhesive paste may be used in place of the adhesive tape 20 in the form of a tape. In this case as well, effects similar to those of the foregoing embodiment can be obtained.

In the embodiment, as the procedure of preparing the adhesive tape 20 having a proper gas release characteristic, the pre-adhesive tape 20Z which does not have a proper gas release characteristic is used. By heating the pre-adhesive tape 20Z to make the gas release characteristic proper, the adhesive tape 20 is prepared. However, the invention is not limited to the procedure. For example, in the case where the adhesive tape 20 having a proper gas release characteristic can be prepared from the beginning, the adhesive tape 20 can be used as it is. Naturally, the work of preparing the adhesive tape 20 by heating the pre-adhesive tape 20Z is unnecessary.

The substrate holding method according to the embodiment of the invention has been described above.

Figure 5:
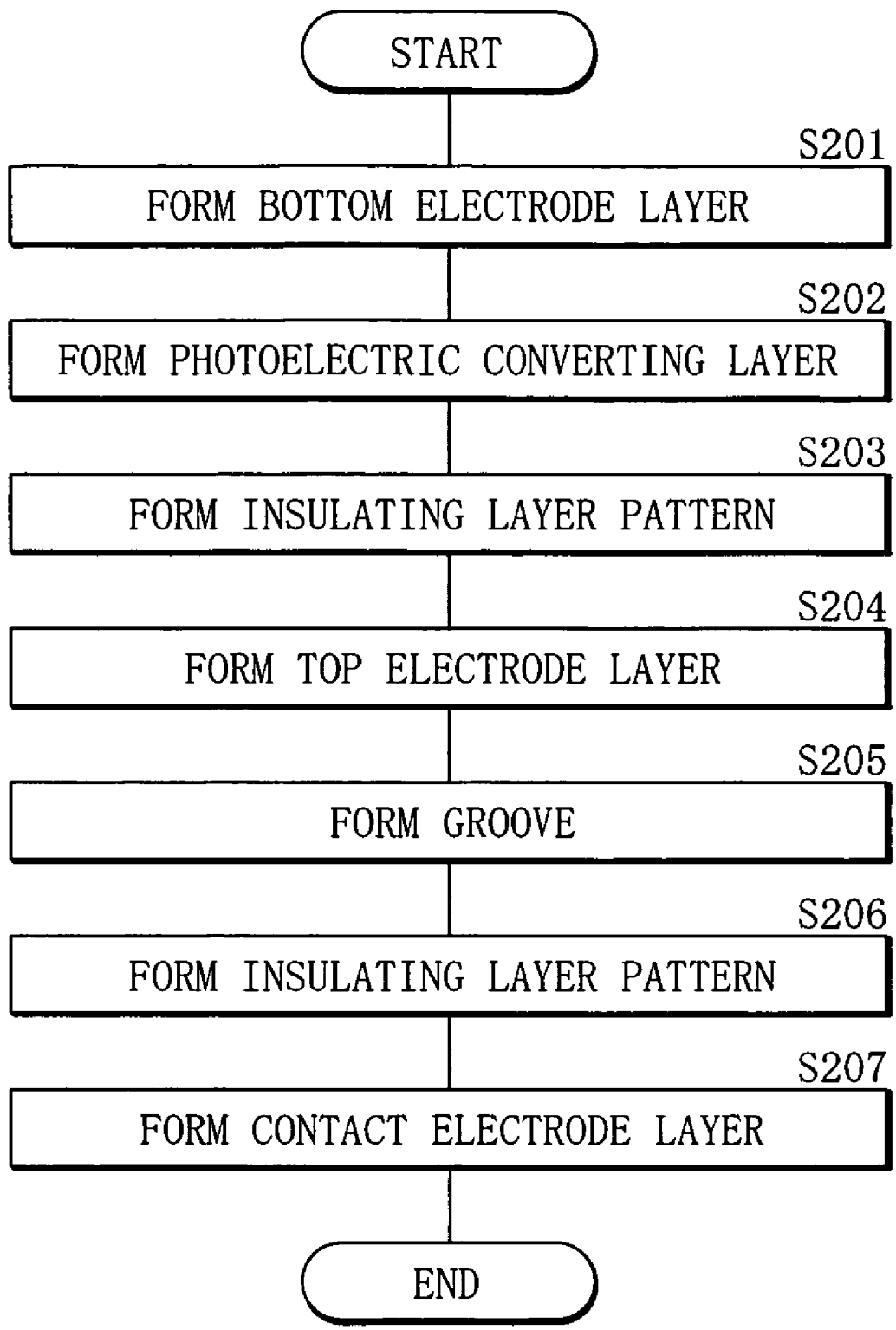
FIG. 5 is a flowchart for explaining the flow of a method of manufacturing a solar battery, using the substrate holding method according to the embodiment of the invention.
Figure 6:
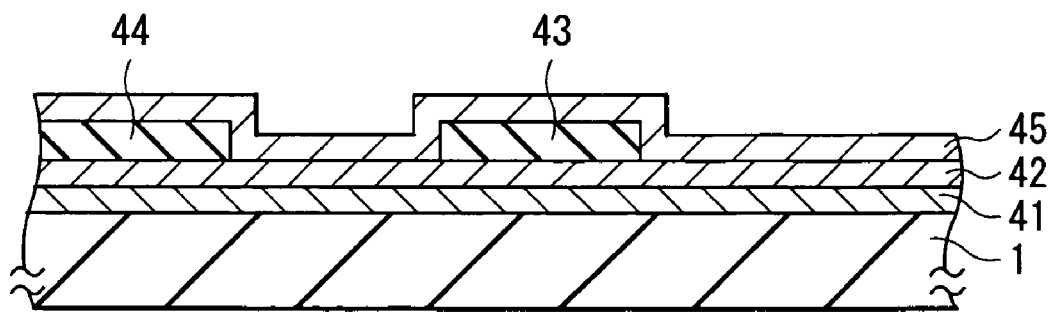
FIG. 6 is a perspective view for explaining a procedure of manufacturing a solar battery.
Figure 7:
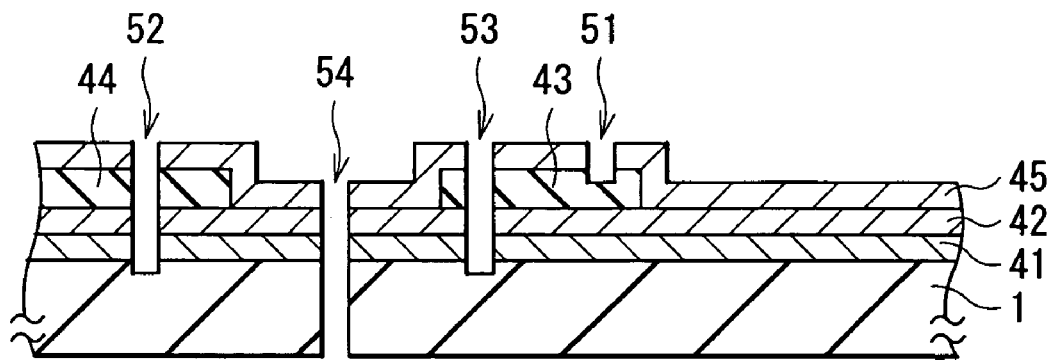
FIG. 7 is a perspective view for explaining a process of manufacturing a solar battery, subsequent to FIG. 6.
Figure 8:
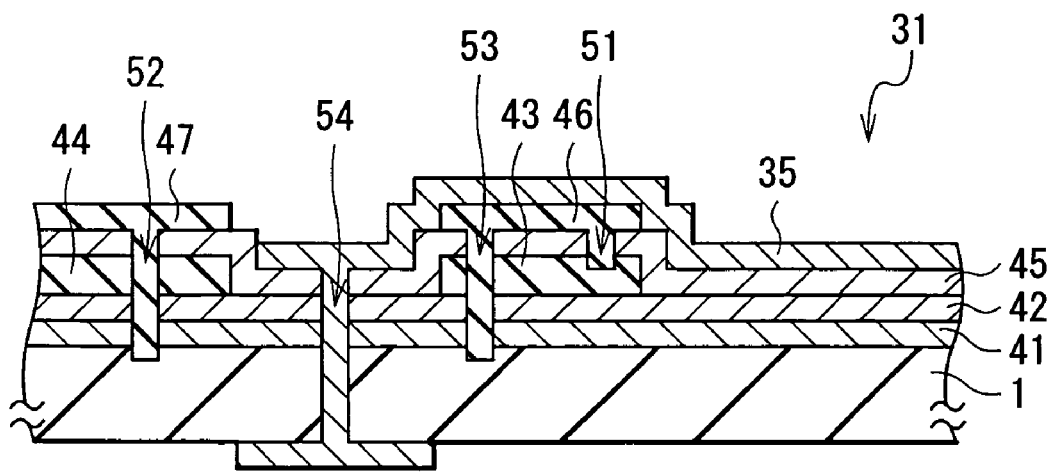
FIG. 8 is a perspective view for explaining a process of manufacturing a solar battery, subsequent to FIG. 7.
Figure 9:
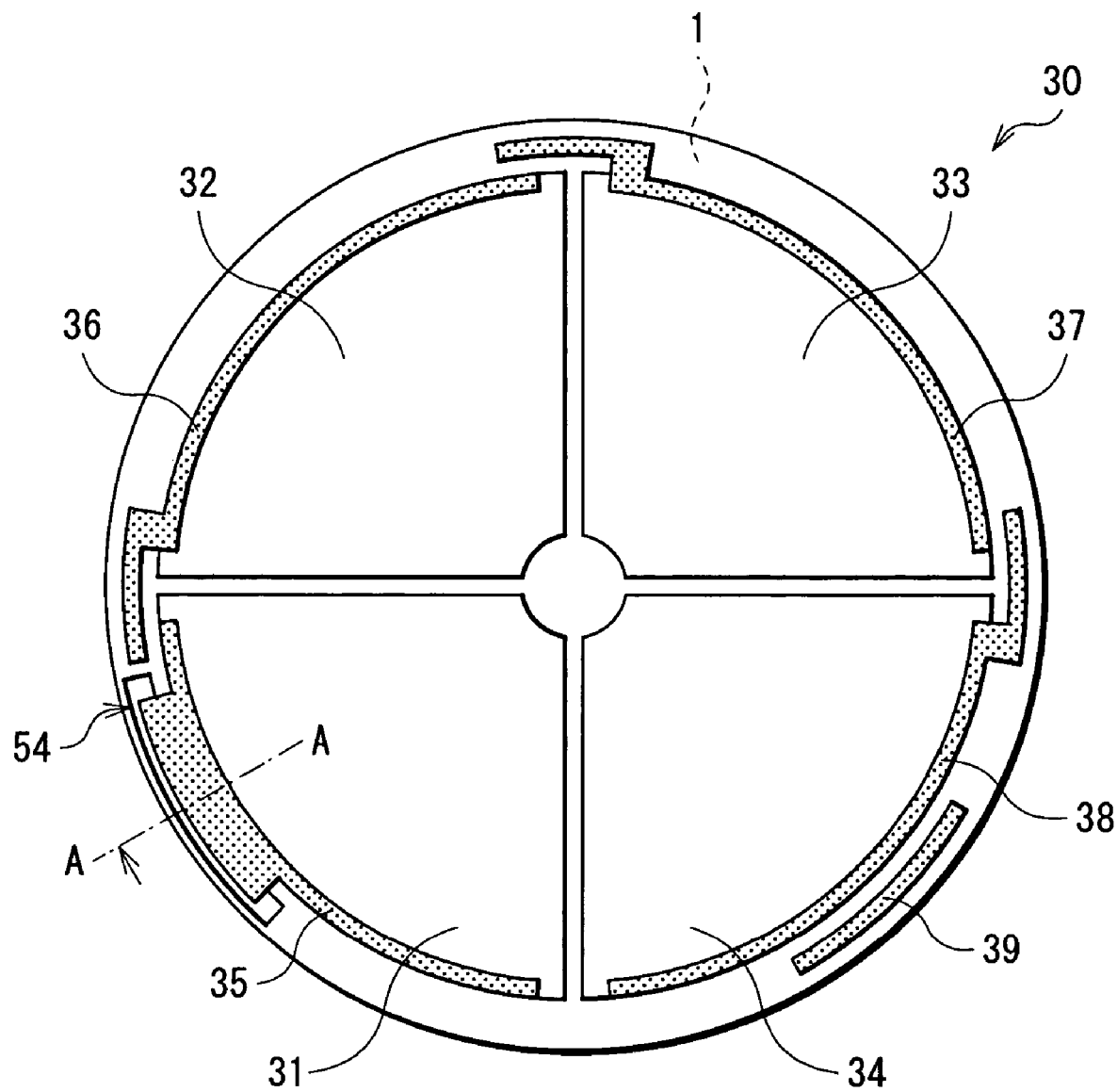
FIG. 9 is a plan view showing the configuration of a solar battery manufactured by using the method of manufacturing a solar battery.

Next, as an example of a method of manufacturing an electronic part by using the substrate holding method of the invention, a method of manufacturing a solar battery will be described. FIG. 5 is a flowchart for explaining the flow of the solar battery manufacturing method. FIGS. 6 to 8 are used for explaining the procedure of manufacturing a solar battery. FIG. 9 is a schematic plan view of a solar battery manufactured by using the solar battery manufacturing method shown in FIGS. 5 to 8. FIGS. 6 to 8 are cross sections taken along line A-A of the solar battery shown in FIG. 9. The arrow attached to the line A-A indicates the direction of the sectional configuration shown in FIGS. 6 to 8. FIG. 5 shows a process of forming a part corresponding to the section taken along line A-A of the solar battery.

In the solar battery manufacturing process, as described above with reference to FIGS. 1 to 4 in the foregoing embodiment, the plastic film 1 is adhered to the holding frame 10 via the adhesive tape 20 which is, for example, prepared by heating the pre-adhesive tape 20Z under the heating conditions of 200° C. and 120 minutes, the plastic film 1 is held by the holding frame 10 and, after that, the plastic film 1 is subjected to the following series of processes in a state where the plastic film 1 is held by the holding frame 10. Specifically, in the solar battery manufacturing process, a plurality of solar cells as electronic devices are pattern-formed in a lump in parallel on the plastic film 1 held by the holding frame 10 and, after that, the plastic film 1 is diced into the solar cells, thereby manufacturing a plurality of solar batteries in a lump. In FIGS. 6 to 8, to simplify the diagrams, the holding frame 10 and the adhesive tape 20 are not shown but only the plastic film 1 is shown.

The configuration of a solar battery manufactured by using the solar battery manufacturing method will be briefly described. For example, as shown in FIG. 9, a solar cell 30 is provided on the plastic film 1. The solar cell 30 includes, mainly, four photoelectric converting units 31 to 34 each having an almost fan shape and five contact electrode layers 35 to 39 for electrically connecting the photoelectric converting units 31 to 34. The photoelectric converting units 31 to 34 are connected in series via the contact electrode layers 35 to 39. Near the photoelectric converting unit 31, for example, a groove 54 for guiding the contact electrode layer 35 to the back side of the plastic film 1 is provided.

At the time of forming the portion corresponding to the section taken along line A-A of the solar battery shown in FIG. 9, first, the plastic film 1 is cleaned as necessary. After that, for example, as shown in FIG. 6, by forming a film made of a conductive material such as aluminum (Al) by using sputtering, a bottom electrode layer 41 as a conductive film is formed so as to cover the plastic film 1 (step S201 in FIG. 5). Subsequently, by forming a film of a semiconductor material such as a non-single crystal silicon by using plasma CVD, a photoelectric converting layer 42 as a semiconductor film is formed so as to cover the bottom electrode layer 41 (step S202 in FIG. 5). The photoelectric converting layer 42 converts photo energy into electric energy by using a photoelectric effect. The photoelectric converting layer 42 is formed so as to have, for example, a p-i-n structure in which a p-type semiconductor layer, an i-type semiconductor layer, and an n-type semiconductor layer are stacked. At this time, as described above, the plastic film 1 is influenced by heat generated at the time of plasma CVD and, by thermal contraction, uniformly stretched so as not to include a wrinkle, so that the surface of the plastic film 1 becomes flat. Since the plasmas are uniformly spread in the whole surface of the plastic film 1 at the time of plasma CVD, the thickness of the photoelectric converting layer 42 becomes uniform. Subsequently, by printing a pattern of an insulating material by using screen printing, insulating layer patterns 43 and 44 as pattern films are formed so as to become ring patterns having different diameters on the photoelectric converting layer 42 (step S203 in FIG. 5). After that, a film is formed of a transparent electrode material such as ITO (Indium Tin Oxide) by using sputtering, thereby forming a top electrode layer 45 as a conductive film so as to cover the insulating layer patterns 43 and 44 and the photoelectric converting layer 42 in the periphery of the insulating layer patterns 43 and 44 (step S204 in FIG. 5). In such a manner, a stacked structure body having a configuration in which the bottom electrode layer 41, photoelectric converting layer 42, insulating layer patterns 43 and 44, and top electrode layer 45 are stacked is formed on the plastic film 1.

Subsequently, for example, as shown in FIG. 7, the stacked structure body as a film to be patterned is selectively irradiated with a laser beam so as to selectively melt the stacked structure body in a pattern, thereby forming four grooves 51 to 54 (step S205 in FIG. 5). To emit the laser beam, for example, a YAG (Yttrium Aluminum Garnet) laser (having a spot diameter of 80 µmφ) is used. In the following, a groove forming process using the laser will be called "laser scribing". At the time of forming the grooves 51 to 54 by using the laser scribing, by changing the intensity of irradiation of the laser and an emission range, the depth and a formation range of each of the grooves 51 to 54 are adjusted. Concretely, the groove 51 is obtained by scribing the insulating layer pattern 43 together with the top electrode layer 45 to some midpoint so as to form a ring pattern. The grooves 52 and 53 are obtained by scribing the plastic film 1 together with the top electrode layer 45, insulating layer patterns 43 and 44, photoelectric converting layer 42 and bottom electrode layer 41 to some midpoint so as to form a ring pattern. The groove 54 is formed by scribing through all of the top electrode layer 45, insulating layer patterns 43 and 44, photoelectric converting layer 42, bottom electrode layer 41, and plastic film 1 so as to form a circular pattern.

Subsequently, for example, as shown in FIG. 8, by printing the pattern of the insulating material by using the screen printing method, an insulating layer pattern 46 as a pattern film is formed so as to bury the grooves 51 and 53 and cover the top electrode layer 45 in the periphery of the grooves 51 and 53, and an insulating layer pattern 47 as a pattern film is formed so as to bury the groove 52 and cover the top electrode layer 45 in the periphery of the groove 52 (step S206 in FIG. 5). Finally, by applying a silver paste, the contact electrode layer 35 is formed so as to bury the groove 54 and cover the top electrode layer 45 and the insulating layer pattern 46 in the periphery of the groove 54 (step S207 in FIG. 5). At the time of forming the contact electrode layer 35, as shown in FIG. 9, the contact electrode layer 35 is formed in a circular pattern and its one end is exposed from the back side of the plastic film 1 via the groove 54. In such a manner, the photoelectric converting unit 31 having a stacked structure in which the bottom electrode layer 41, photoelectric converting layer 42, insulating layer patterns 43 and 44, top electrode layer 45, and insulating layer patterns 46 and 47 are stacked is formed and the contact electrode layer 35 is formed. Thereby, the portion corresponding to the section taken along line A-A of the solar battery is completed.

Although only the process of forming the portion (the photoelectric converting unit 31 and the contact electrode layer 35) corresponding to the section taken along line A-A of the solar battery has been described as the solar battery manufacturing method, by using the manufacturing process, specifically, the process of forming the bottom electrode layer 41 and the top electrode layer 45 as conductive films, the process of forming the photoelectric converting layer 42 as a semiconductor film by the CVD, the process of forming the insulating layer patterns 43, 44, 46, and 47 by using the screen printing method, and the process of patterning a film to be patterned by using a laser (laser scribing), portions corresponding to sections other than the section taken along line A-A of the solar battery (the photoelectric converting units 32 to 34 and the contact electrode layers 36 to 39) can be similarly formed.

In the solar battery manufacturing method, a solar battery is manufactured by forming the solar cell 30 on the plastic film 1 held by using the substrate holding method of the invention. Consequently, as described above, the release quantity of unnecessary gas released from the adhesive tape 20 during the solar battery manufacturing process is suppressed. In this case, different from the case where the plastic film 1 is held by the holding frame 10 by using an adhesive tape which does not have a proper gas release characteristic so that the performance of a solar battery tends to deteriorate due to unnecessary gas released from the adhesive tape, deterioration in the performance of the solar battery due to the unnecessary gas is suppressed. Thus, the performance of the solar battery can be improved.

In particular, in the solar battery manufacturing method, by using the substrate holding method of the invention, as described above, the plastic film 1 is uniformly stretched by being thermally contracted due to the influence of heat generated during the solar battery manufacturing process, and the surface of the plastic film 1 becomes flat, so that plasmas are uniformly spread in the whole surface of the plastic film 1 at the time of plasma CVD. Therefore, the thickness of the photoelectric converting layer 42 can be controlled to be uniform in the film plane.

The procedure, action, effect, and modification other than the above related to the solar battery manufacturing method are similar to those of the foregoing embodiment, so that their description will not be repeated.

EXAMPLE

A concrete example of the invention will now be described.

A solar battery was manufactured by the solar battery manufacturing method of the invention.

First, by the following procedure, the plastic film was held on the holding frame. Specifically, a holding frame manufactured by Celanx K.K. made of a silicon carbide-aluminum composite material was prepared and a pre-adhesive tape was adhered to the holding frame so as to surround an opening formed in the holding frame from four sides. As the pre-adhesive tape, the acrylic both-faced adhesive tape No. 5915 manufactured by Nitto Denko Corporation was used. Subsequently, the pre-adhesive tape was heated by using a clean oven to make the gas release characteristic of the pre-adhesive tape proper so that the total quantity of gas detected when analysis using the gas chromatograph mass spectrometry was conducted under test conditions of 180° C. and 10 minutes becomes 100.5 μg/g or less in n-tetradecane, thereby preparing an adhesive tape. By using the adhesive tape, a plastic film made of PEN was adhered to the holding frame so as to close the opening provided in the holding frame. In such a manner, the plastic film is held by the holding frame via the adhesive tape.

Next, a solar cell was formed on the plastic film held by the holding frame by the procedure which will be described below, thereby manufacturing a solar battery. Specifically, first, the plastic film was subjected to ultrasonic cleaning as necessary and, after that, a film made of aluminum was formed by sputtering, thereby forming a bottom electrode layer so as to cover the plastic film. Subsequently, by forming a film of non-single crystal silicon by using plasma CVD, a photoelectric converting layer having the p-i-n structure was formed so as to cover the bottom electrode layer. After that, an insulating layer pattern was formed on the photoelectric converting layer by pattern printing using the screen printing method. A film made of ITO was formed by using sputtering, thereby forming a top electrode layer so as to cover the insulating layer pattern and the photoelectric converting layer in the periphery of the insulating layer pattern. As a result, a stacked structure body having a configuration in which the bottom electrode layer, the photoelectric converting layer, the insulating layer pattern, and the top electrode layer are stacked was formed on the plastic film. By patterning the stacked structure body by using laser scribing, a plurality of grooves were formed. At the time of forming the grooves, a groove (through groove) penetrating the stacked structure body and a groove (not-through groove) which does not penetrate the stacked structure body were formed. Subsequently, another insulating layer pattern was formed so as to cover the not-through groove and the top electrode layer in the periphery of the not-through groove by pattern printing using the screen printing method. Finally, by applying a silver paste, a plurality of contact electrode layers were formed so as to bury the through grooves and the top electrode layer and the insulating layer pattern in the periphery of the through grooves. As a result, a plurality of photoelectric converting units having the stacked structure in which the bottom electrode layer, photoelectric converting layer, insulating layer pattern, top electrode layer, and insulating layer pattern are stacked were formed, the plurality of contact electrode layers were formed, and the photoelectric converting units were connected in series via the contact electrode layers, thereby completing a solar battery.

Example 1

A pre-adhesive tape was heated under heating conditions of 200° C. and 120 minutes in order to prepare an adhesive tape and a solar battery was manufactured by the above-described procedure.

Example 2

A pre-adhesive tape was heated under heating conditions of 200° C. and 30 minutes in order to prepare an adhesive tape and a solar battery was manufactured by the above-described procedure.

Comparative Example

A solar battery was manufactured by a procedure similar to that of Example 1 except for the point that a pre-adhesive tape which was not heated, that is, a pre-adhesive tape whose gas release characteristic was not made proper was used as it is and a plastic film was adhered to a holding frame.

The performances of the solar batteries in Examples 1 and 2 and Comparative Example were examined and the following result was obtained.

First, the gas release characteristic of the pre-adhesive tape used in Comparative Example and that of the adhesive tape used in Example 1 were examined by using the gas chromatograph mass spectrometry and the results shown in Table 1 were obtained. Table 1 indicates the gas release characteristic based on the result of the gas chromatograph mass spectrometry. In Table 1, the component number, retention time (minutes), gas quantity (μg/g), gas total quantity, and qualification result are shown with respect to each of the pre-adhesive tape and the adhesive tape.

At the time of analyzing the pre-adhesive tape and the adhesive tape by using the gas chromatograph mass spectrometry, an analyzer constructed by connecting the Curie point head space sampler JHS-100A manufactured by Japan Analytical Industry Co., Ltd. to the gas chromatograph mass spectrometer GC-MS QP-5050A manufactured by Shimadzu Corporation was used and an analyzing work was done in the following procedure. A sample tube made of glass and mounted on the analyzer was filled with 10 mg of a sample (the pre-adhesive tape and the adhesive tape) and was heated under the heating conditions of 180° C. and 10 minutes while flowing helium (He) gas as a purge gas into the sample tube at a flow rate of 50 mL/min. Gas generated during the heating was trapped by an adsorbent made of quartz wool which was cooled to −60° C. Subsequently, the temperature of the adsorbent tube was reset to the room temperature and, after that, the adsorbent tube was rapidly heated under the heating conditions of 358° C. and 29 seconds. The gas desorbed at this time was analyzed. As a column of the gas chromatograph, J&W DB-5MS (0.25 mm×30 mm, thickness=0.25 μm) manufactured by Agilent Technologies Inc. was used. The temperature of the column was held at 40° C. for two minutes, increased to 300° C. at a temperature increasing speed of 10° C./min and then held at 300° C. for 15 minutes. As a carrier gas, helium gas (pressure=100 kPa and initial flow rate=1.8 mL/min.) was used and 1% of the helium gas was introduced when the injection temperature of a sample introduction part was 300° C. and the sample split ratio was 100. As the mass spectrometer conditions, the scan mode m/z was set to 33 to 350 and the interface temperature was set to 300° C. By the above-described analyzing procedure, a qualitative analysis of the desorbed gas was conducted on the basis of total ion chromatograph (TIC) and a mass spectrum and a quantitative analysis of the desorbed gas was conducted by conversion based on a calibration curve of n-tetradecane as a standard sample.

TABLE 1

| component number | retention time (min) | pre-adhesive tape gas quantity (μg/g) | adhesive tape gas quantity (μg/g) | qualification result |
|---|---|---|---|---|
| 1 | 9.0 | 10.9 | 2.8 | aliphatic hydrocarbon |
| 2 | 9.2 | 14.2 | 2.9 | aliphatic alcohol |

TABLE 1-continued

| component number | retention time (min) | pre-adhesive tape gas quantity (μg/g) | adhesive tape gas quantity (μg/g) | qualification result |
|---|---|---|---|---|
| 3 | 9.4 | 85.7 | 19.7 | aliphatic hydrocarbon |
| 4 | | ↑ | ↑ | aliphatic hydrocarbon |
| 5 | 9.5 | 65.7 | 17.5 | aliphatic alcohol |
| 6 | 9.7 | 50.4 | 12.1 | aliphatic hydrocarbon |
| 7 | 12.2 | 33.2 | | acrylic ester |
| 8 | 12.3 | 8.2 | | acrylic ester |
| 9 | 12.4 | 35.7 | | acrylic ester |
| 10 | 12.6 | 49.8 | | acrylic ester |
| 11 | 12.7 | 60.2 | | acrylic ester |
| 12 | 12.8 | 68.5 | | acrylic ester |
| 13 | 12.8 | 84.3 | | acrylic ester |
| 14 | 13.1 | 75.5 | | acrylic ester |
| 15 | 13.5 | 17.4 | | acrylic ester |
| 16 | 15.0 | 3.5 | | butyl hydroxyl toluene |
| Others | | 54.9 | | |
| Total qty of gas | | 718.0 | 55.0 | |

As understood from the result shown in Table 1, gases containing aliphatic hydrocarbon, aliphatic alcohol, and acrylic ester were detected with respect to each of the pre-adhesive tape used in Comparative Example and the adhesive tape used in Example 1. However, when the total quantity of gas of the pre-adhesive tape which is not subjected to heating process and that of the adhesive tape subjected to the heating process are compared with each other, the total quantity of the gas of the adhesive tape is much smaller than that of the pre-adhesive tape. More concretely, the total quantity of the gas of the pre-adhesive tape was 718.0 μg/g and, on the other hand, that of the adhesive tape was 55.0 μg/g. Although concrete data will not be described, the gas release characteristic of the adhesive tape used Example 2 was also similarly examined. The total quantity of the gas related to the adhesive tape was 100.5 μg/g and is much lower than that of the pre-adhesive tape. Consequently, it was recognized that the quantity of gas released from the pre-adhesive tape subjected to the heating process decreases by performing the heating process on the pre-adhesive tape, so that the pre-adhesive tape can be converted to the adhesive tape by using the heating process.

Subsequently, the performances of the solar batteries of Examples 1 and 2 and Comparative Example were examined and the result shown in Table 2 was obtained. Table 2 shows the power generating performances of the solar batteries. Table 2 shows, as factors of determining the power generating performance of a solar battery, open circuit voltage Voc (V), short-circuit current Isc (mA), fill factor FF, and power generating efficiency (%). As a reference, the total quantity of gas (μg/g) is also shown. In Table 2, data in the columns of "Examples 1 and 2" indicates the performance results of the solar batteries manufactured by using the solar battery manufacturing methods of Examples 1 and 2. Data in the columns of "Comparative Example" indicates the performance result of the solar battery manufactured by using the solar battery manufacturing method of Comparative Example. The "power generating efficiency" shown in Table 2 is calculated as a product of the open circuit voltage Voc, short-circuit current Isc, and fill factor FF (the power generating efficiency=open circuit voltage Voc×short-circuit current Isc×fill factor FF).

TABLE 2

| | Comparative Example | Example 1 | Example 2 |
|---|---|---|---|
| Total quantity of gas (μg/g) | 718.0 | 55.0 | 100.5 |
| Open circuit voltage Voc (V) | 0.82 | 0.86 | 0.86 |
| Short-circuit current Ics (mA) | 13.5 | 16.2 | 16.0 |
| Fill factor FF | 0.622 | 0.730 | 0.725 |
| Power generating efficiency (%) | 6.89 | 10.20 | 9.98 |

As understood from the results shown in Table 2, when the power generating performances of the solar batteries of Examples 1 and 2 and that of Comparative Example are compared, each of the open circuit voltage Voc, short-circuit current Isc, and fill factor FF of Examples 1 and 2 is larger than that of Comparative Example. As a result, the power generating efficiency of the solar battery of Examples 1 and 2 is higher than that of Comparative Example. More concretely, the power generating efficiency of the solar battery of Comparative Example (total gas quantity=718.0 μg/g) is 6.89%. In contrast, the power generating efficiency of Example 1 (total gas quantity=55.0 μg/g) is 10.20% and that in Example 2 (total gas quantity=100.5 μg/g) is 9.98%. That is, the power generating efficiency improved by about 48.0% in Example 1 as compared with Comparative Example and the power generating efficiency improved by about 44.8% in Example 2 as compared with Comparative Example. From the above, in the solar battery manufactured by using the solar battery manufacturing method of the invention, with respect to the relation between the gas release characteristic of an adhesive tape (total quantity of gas detected when analysis using the gas chromatograph mass spectrometry was conducted under the test conditions of 180° C. and 10 minutes) and the power generating performance of the solar battery, in the case where the gas total quantity is 100.5 μg/g or less in n-tetradecane, an excellent power generating performance was obtained. Therefore, by using an adhesive tape whose total quantity of gas detected when analysis using the gas chromatograph mass spectrometry was carried out under the test conditions of 180° C. and 10 minutes is 100.5 μg/g or less in n-tetradecane, the release amount of unnecessary gas released from the adhesive tape during the process of manufacturing the solar battery is suppressed and deterioration in the power generating efficiency of the solar battery caused by the unnecessary gas is suppressed. Thus, it was confirmed that the power generating performance of the solar battery improves.

Although the invention has been described above by the embodiments and examples, the invention is not limited to the embodiments and examples but can be variously modified. Concretely, for example, in the foregoing embodiments and examples, the case of applying the substrate holding method of the invention to the solar battery manufacturing method has been described above but the invention is not always limited to the case. For example, the substrate holding method of the invention may be applied to the method of manufacturing another electronic part other than the solar battery. An example of the "another electronic part" is a TFT (Thin Film Transistor) element formed on an FPC substrate. Also in the case where the substrate holding method of the invention is applied to the "another electronic part", effects similar to those of the foregoing embodiments and examples can be obtained.

The substrate holding method according to the invention can be applied to the method of manufacturing an electronic part typified by a solar battery.

Obviously many modifications and variations of the present invention are possible in the light of the above teachings. It is therefore to be understood that within the scope of the appended claims the invention may be practiced otherwise than as specifically described.

What is claimed is:

1. A method of holding a flexible substrate on a holding jig, comprising,
adhering the substrate to the holding jig by using an adhesive whose total quantity of gas detected when analysis using gas chromatograph mass spectrometry is conducted under test conditions of 180° C. and 10 minutes is 100.5 μg/g or less in n-tetradecane.

2. A method of holding a substrate according to claim 1, wherein the adhesive is an acrylic adhesive from which gas containing aliphatic hydrocarbon, aliphatic alcohol, and acrylic ester is detected.

3. A method of holding a substrate according to claim 1, further comprising:
heating a pre-adhesive to obtain the adhesive.

4. A method of holding a substrate according to claim 1, wherein a substrate having a thermal contraction property is used as the substrate.

5. A method of manufacturing an electronic part, comprising,
adhering a flexible substrate to a holding jig by using an adhesive whose total quantity of gas detected when analysis using gas chromatograph mass spectrometry is conducted under test conditions of 180° C. and 10 minutes is 100.5 μg/g or less in n-tetradecane; and forming an electronic device on the substrate to manufacture an electronic part.

6. A method of manufacturing an electronic part according to claim 5, wherein a solar battery is manufactured as the electronic part by forming a solar cell as the electronic device.

7. A method of manufacturing an electronic part according to claim 6, further comprising:
preparing the adhesive by heating a pre-adhesive, the pre-adhesive being heated under heating conditions of 200° C. and 120 minutes.

8. A method of manufacturing an electronic part according to claim 6, further comprising:
forming the solar battery device by forming a conductive film.

9. A method of manufacturing an electronic part according to claim 6, further comprising:
forming the solar battery device by forming a semiconductor film by using chemical vapor deposition (CVD).

10. A method of manufacturing an electronic part according to claim 6, further comprising:
forming the solar battery device by forming a pattern film by using a screen printing method.

11. A method of manufacturing an electronic part according to claim 6, further comprising:
forming the solar battery device by patterning a film to be patterned by using a laser.

12. A method of holding a substrate according to claim 1, wherein the adhesive is an adhesive tape.

13. A method of holding a substrate according to claim 12, wherein the adhesive tape is an acrylic adhesive tape.

14. A method of holding a substrate according to claim 12, wherein the adhesive tape is a silicon adhesive tape.

15. A method of holding a substrate according to claim 1, wherein the adhesive is a gel adhesive paste.

16. A method of manufacturing an electronic part according to claim 5, wherein the adhesive is an acrylic adhesive from which gas containing aliphatic hydrocarbon, aliphatic alcohol, and acrylic ester is detected.

17. A method of manufacturing an electronic part according to claim 5, wherein the adhesive is an adhesive tape.

18. A method of manufacturing an electronic part according to claim 17, wherein the adhesive tape is an acrylic adhesive tape.

19. A method of manufacturing an electronic part according to claim 17, wherein the adhesive tape is a silicon adhesive tape.

20. A method of manufacturing an electronic part according to claim 5, wherein the adhesive is a gel adhesive paste.

* * * * *